(12) United States Patent
Ko

(10) Patent No.: US 12,009,187 B2
(45) Date of Patent: Jun. 11, 2024

(54) PLASMA SHUTTER AND SUBSTRATE PROCESSING APPARATUS INCLUDING THE SAME

(71) Applicant: SAMSUNG ELECTRONICS CO., LTD., Suwon-si (KR)

(72) Inventor: Hyungsik Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/208,046

(22) Filed: Jun. 9, 2023

(65) Prior Publication Data

US 2024/0096606 A1 Mar. 21, 2024

(30) Foreign Application Priority Data

Sep. 15, 2022 (KR) .................. 10-2022-0116697
Feb. 3, 2023 (KR) .................. 10-2023-0015153

(51) Int. Cl.
*H01J 37/32* (2006.01)

(52) U.S. Cl.
CPC .. *H01J 37/32807* (2013.01); *H01J 37/32495* (2013.01); *H01J 37/32513* (2013.01)

(58) Field of Classification Search
CPC .......... H01J 37/32513; H01J 37/32495; H01J 37/32807

See application file for complete search history.

(56) References Cited

U.S. PATENT DOCUMENTS

| 2015/0114564 A1* | 4/2015 | Kitabata .......... H01J 37/32651 |
| | | 156/345.31 |
| 2015/0187542 A1* | 7/2015 | Ishida .............. H01J 37/32495 |
| | | 156/345.1 |
| 2018/0061619 A1 | 3/2018 | Matsuura et al. |

FOREIGN PATENT DOCUMENTS

| JP | 4814384 B2 | 11/2011 |
| JP | 6064707 B2 | 1/2017 |
| JP | 2018-037584 A | 3/2018 |
| KR | 10-2007-0036348 A | 4/2007 |
| KR | 10-0719806 B1 | 5/2007 |
| KR | 10-0938245 B1 | 1/2010 |
| KR | 10-1332219 B1 | 11/2013 |
| KR | 10-2019-0003064 A | 1/2019 |

* cited by examiner

*Primary Examiner* — Evan P Dzierzynski
*Assistant Examiner* — Nathaniel J Lee
(74) *Attorney, Agent, or Firm* — Sughrue Mion, PLLC

(57) ABSTRACT

Provided is a substrate processing apparatus, including a process chamber, a plasma shutter configured ascend to close the process chamber, and an upper liner on the process chamber, wherein the process chamber includes a process space in which a substrate process is performed, and an insertion passage adjacent to the process space and connecting the process space to an outside of the process chamber, wherein the upper liner includes an extension liner, wherein the extension liner faces a connection inner surface that upwardly extends from an inner end of a passage ceiling forming the insertion passage, and wherein, in a state where the plasma shutter ascends to close the process space, an upper end of the plasma shutter is inserted between the connection inner surface and the extension liner.

20 Claims, 15 Drawing Sheets

PLASMA SHUTTER AND SUBSTRATE PROCESSING APPARATUS INCLUDING THE SAME

CROSS-REFERENCE TO RELATED APPLICATIONS

This U.S. nonprovisional application claims priority to Korean Patent Applications No. 10-2022-0116697 filed on Sep. 15, 2022 and No. 10-2023-0015153 filed on Feb. 3, 2023 in the Korean Intellectual Property Office, the disclosures of which are hereby incorporated by reference in their entirety.

BACKGROUND

Embodiments of the present disclosure relate to a plasma shutter and a substrate processing apparatus including the same, and more particularly, to a plasma shutter that can achieve exact alignment and a substrate processing apparatus including the same.

A semiconductor device may be fabricated by using various processes. For example, a semiconductor device may be manufactured by allowing a silicon wafer to undergo a photolithography process, an etching process, a deposition process, and so forth. Various fluids may be used in such processes. For example, plasma may be used in an etching process and/or a deposition process.

SUMMARY

One or more embodiments provide a plasma shutter that can be aligned to close a process space and a substrate processing apparatus including the same.

One or more embodiments provide a plasma shutter that can reduce the occurrence of particle and a substrate processing apparatus including the same.

One or more embodiments provide a plasma shutter that can improve plasma dispersion and a substrate processing apparatus including the same.

One or more embodiments provide a plasma shutter that can increase a substrate process yield and a substrate processing apparatus including the same.

The object of the present disclosure is not limited to the mentioned above, and other objects which have not been mentioned above will be clearly understood to those skilled in the art from the following description.

According to an aspect of an embodiment, there is provided a substrate processing apparatus, including a process chamber, a plasma shutter configured ascend to close the process chamber, and an upper liner on the process chamber, wherein the process chamber includes a process space in which a substrate process is performed, and an insertion passage adjacent to the process space and connecting the process space to an outside of the process chamber, wherein the upper liner includes an extension liner, wherein the extension liner faces a connection inner surface that upwardly extends from an inner end of a passage ceiling forming the insertion passage, and wherein, in a state where the plasma shutter ascends to close the process space, an upper end of the plasma shutter is inserted between the connection inner surface and the extension liner.

According to another aspect of an embodiment, there is provided a plasma shutter, including a shield door, and a connection block adjacent to the shield door, wherein the shield door includes a shield member having a plasma shield surface, and a support member on a surface of the shield member opposite to the plasma shield surface, wherein the plasma shield surface is convexly curved toward the connection block, and wherein a level of a top surface of the shield member is higher than a level of a top surface of the support member in a vertical direction.

According to another aspect of an embodiment, there is provided a plasma shutter, including a shield door, a connection block adjacent to the shield door, and a gasket, wherein the shield door includes a shield member having a plasma shield surface, and a support member on a surface of the shield member opposite to the plasma shield surface, wherein a level of a top surface of the shield member is higher than a level of a top surface of the support member in a vertical direction, wherein a gasket groove is formed on the top surface of the support member, the gasket being inserted in the gasket groove, and wherein the gasket includes a nickel alloy.

BRIEF DESCRIPTION OF DRAWINGS

The above and other aspects, features, and advantages of embodiments will be more apparent from the following description taken in conjunction with the accompanying drawings, in which.

DETAILED DESCRIPTION OF EMBODIMENTS

Figure 1:
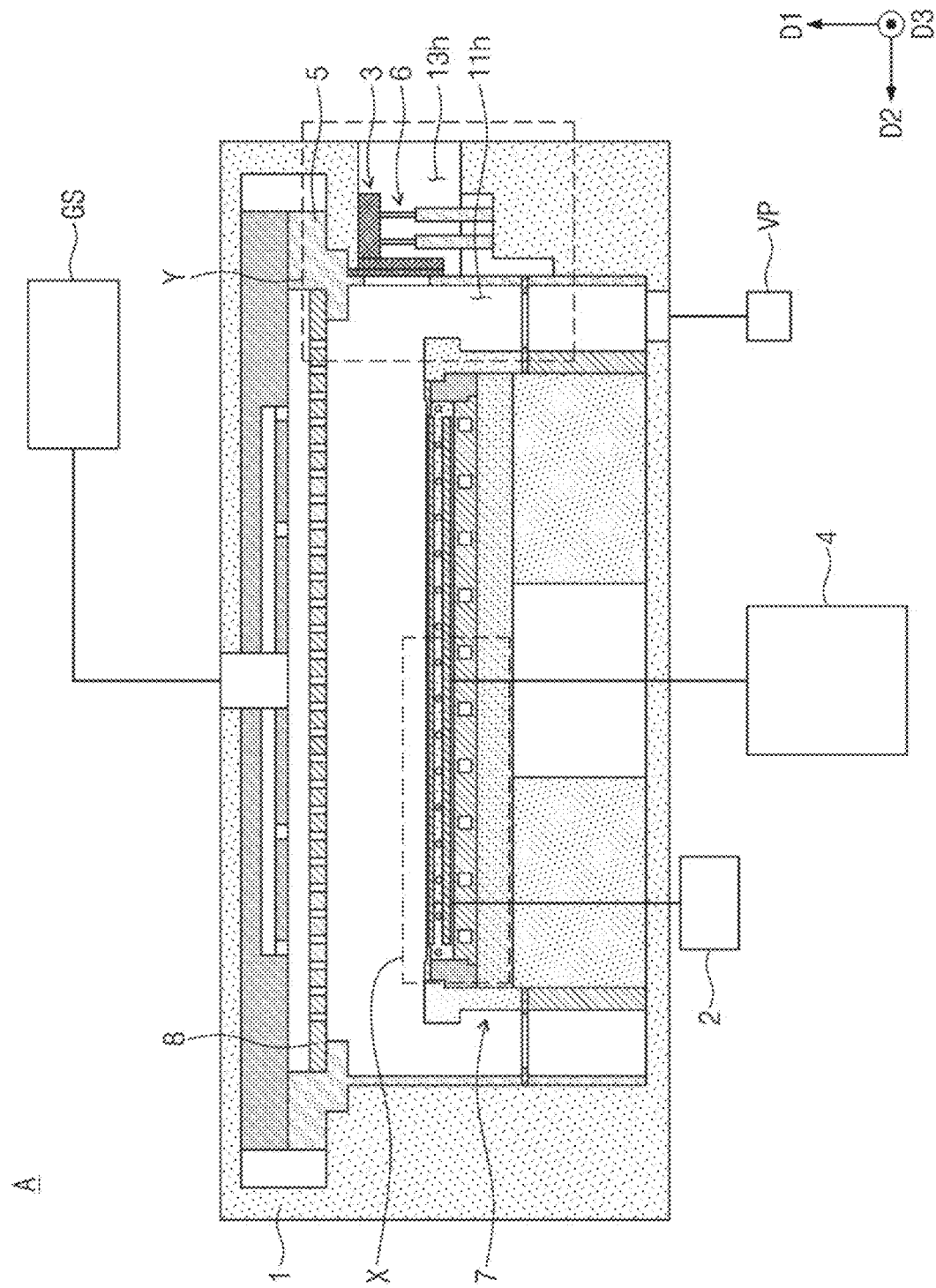
FIG. 1 illustrates a cross-sectional view showing a substrate processing apparatus according to some embodiments.

The following will now describe embodiments with reference to the accompanying drawings. Like reference numerals may indicate like components throughout the description. Embodiments described herein are example embodiments, and thus, the disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

FIG. 1 illustrates a cross-sectional view showing a substrate processing apparatus according to some embodiments.

In the present disclosure, D1 may indicate a first direction, D2 may indicate a second direction that intersects the first direction D1, and D3 may indicate a third direction that intersects each of the first direction D1 and the second direction D2. The first direction D1 may be called a vertical direction. Each of the second direction D2 and the third direction D3 may be called a horizontal direction.

Referring to FIG. 1, a substrate processing apparatus A may be provided. The substrate processing apparatus A may be configured to allow a substrate to undergo an etching process and/or a deposition process. The substrate may include a silicon (Si) wafer, but embodiments are not limited thereto. The substrate processing apparatus A may use plasma to treat a substrate. The substrate processing apparatus A may generate plasma in various ways. For example, the substrate processing apparatus A may be a capacitively coupled plasma (CCP) apparatus and/or an inductively coupled plasma (ICP) apparatus. For example, a CCP type substrate processing apparatus will be described. The substrate processing apparatus A may include a process chamber 1, a stage 7, a showerhead 8, a plasma shutter 3, a shutter driving mechanism 6, an upper liner 5, a direct-current (DC) power generator 2, a radio-frequency (RF) power generator 4, a vacuum pump VP, and a gas supply device GS.

The process chamber 1 may provide a process space 11h. A substrate process may be performed in the process space 11h. The process space 11h may be separated from an external space. The process space 11h may be in a substantial vacuum state during a substrate process. The process chamber 1 may have a cylindrical shape, but embodiments are not limited thereto.

The process chamber 1 may further provide an insertion passage 13h. The insertion passage 13h may be connected to the process space 11h. For example, the insertion passage 13h may be provided adjacent to and extend from the process space 11h toward the outside of the process chamber 1. The insertion passage 13h may connect the process space 11h to the outside. A substrate may be introduced through the insertion passage 13h to the process space 11h. A detailed description thereof will be further discussed below.

The stage 7 may be positioned in the process chamber 1. For example, the stage 7 may be positioned in the process space 11h. The stage 7 may support and/or fix a substrate. A substrate process may be performed in a state where a substrate is placed on the stage 7. The stage 7 will be further discussed below.

The showerhead 8 may be positioned in the process chamber 1. For example, the showerhead 8 may be positioned in the process space 11h. The showerhead 8 may be disposed above and spaced apart from the stage 7 in the vertical direction (D1). The showerhead 8 may provide a gas hole (see 8h of FIG. 3). A gas supplied from the gas supply device GS may be uniformly sprayed through the showerhead 8 into the process space 11h. The showerhead 8 may be supported by the upper liner 5. A detailed description thereof will be further discussed below.

The plasma shutter 3 may close and seal the process chamber 1. When the plasma shutter 3 is closed, the process space 11h and the insertion passage 13h may be separated from each other. When the plasma shutter 3 is closed, the process space 11h may be isolated from the outside of the process chamber 1. The plasma shutter 3 will be further discussed in detail below.

The shutter driving mechanism 6 may drive the plasma shutter 3. For example, the shutter driving mechanism 6 may drive the plasma shutter 3 to move the plasma shutter 3 up and down to close and open the process chamber 1. The shutter driving mechanism 6 may include a hydraulic device or an actuator such as a motor. The shutter driving mechanism 6 may be positioned below the insertion passage 13h, but embodiments are not limited thereto. The shutter driving mechanism 6 will be further discussed in detail below.

The upper liner 5 may be combined with the process chamber 1. The upper liner 5 will be further discussed in detail below.

The DC power generator 2 may apply a DC power to the stage 7. The DC power applied from the DC power generator 2 may rigidly place a substrate on a certain position on the stage 7.

The RF power generator 4 may supply a RF power to the stage 7. It may thus be possible to control plasma in the process space 11h. A detailed description thereof will be further discussed below.

The vacuum pump VP may be connected to the process space 11h. The vacuum pump VP may apply a vacuum pressure to the process space 11h during a substrate process.

The gas supply device GS may supply a gas to the process space 11h. The gas supply device GS may include a gas tank, a compressor, and a valve. The plasma may be generated from a portion of gas supplied from the gas supply device GS to the process space 11h.

Figure 2:
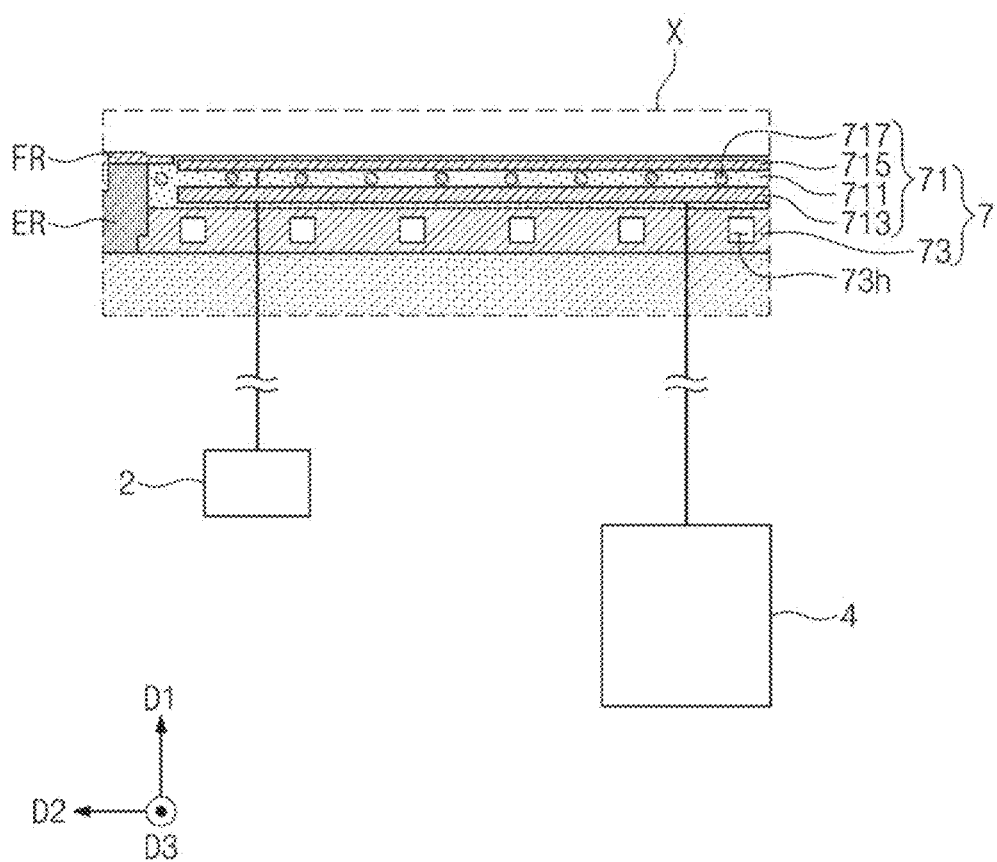
FIG. 2 illustrates an enlarged cross-sectional view showing section X of FIG. 1.

FIG. 2 illustrates an enlarged cross-sectional view showing section X of FIG. 1.

Referring to FIG. 2, the stage 7 may include a chuck 71 and a cooling plate 73.

A substrate may be disposed on the chuck 71. The chuck 71 may fix a substrate on a certain position of the chuck 71. The chuck 71 may include a chuck body 711, a plasma electrode 713, a chuck electrode 715, and a heater 717.

The chuck body 711 may have a cylindrical shape. The chuck body 711 may include, for example, ceramic material, but embodiments are not limited thereto. A substrate may be disposed on a top surface of the chuck body 711. The chuck body 711 may be provided adjacent to and surrounded by a focus ring FR and/or an edge ring ER.

The plasma electrode 713 may be positioned in the chuck body 711. The plasma electrode 713 may include aluminum (Al). The plasma electrode 713 may have a disk shape, but embodiments are not limited thereto. The plasma electrode 713 may be supplied with a RF power. For example, the RF power generator 4 may apply the RF power to the plasma electrode 713. The RF power applied to the plasma electrode 713 may control the plasma in the process space (see 11h of FIG. 1).

The chuck electrode 715 may be positioned in the chuck body 711. The chuck electrode 715 may be positioned above the plasma electrode 713 in the vertical direction (D1). The chuck electrode 715 may be supplied with a DC power. For example, the DC power generator 2 may apply the DC power to the chuck electrode 715. The DC power applied to the chuck electrode 715 may rigidly place a substrate on a certain position on the chuck body 711. The chuck electrode 715 may include aluminum (Al), but embodiments are not limited thereto.

The heater 717 may be positioned in the chuck body 711. The heater 717 may be positioned between the chuck electrode 715 and the plasma electrode 713. The heater 717 may include a hot wire. For example, the heater 717 may include a concentrically circular shaped hot wire. The heater 717 may radiate heat to the surrounding environment. Therefore, the chuck body 711 may have an increased temperature.

The cooling plate 73 may be positioned below the chuck 71. For example, the chuck 71 may be positioned on the cooling plate 73. The cooling plate 73 may provide a cooling hole 73h. Cooling water may flow in the cooling hole 73h. The cooling water in the cooling hole 73h may absorb heat from the cooling plate 73.

Figure 3:
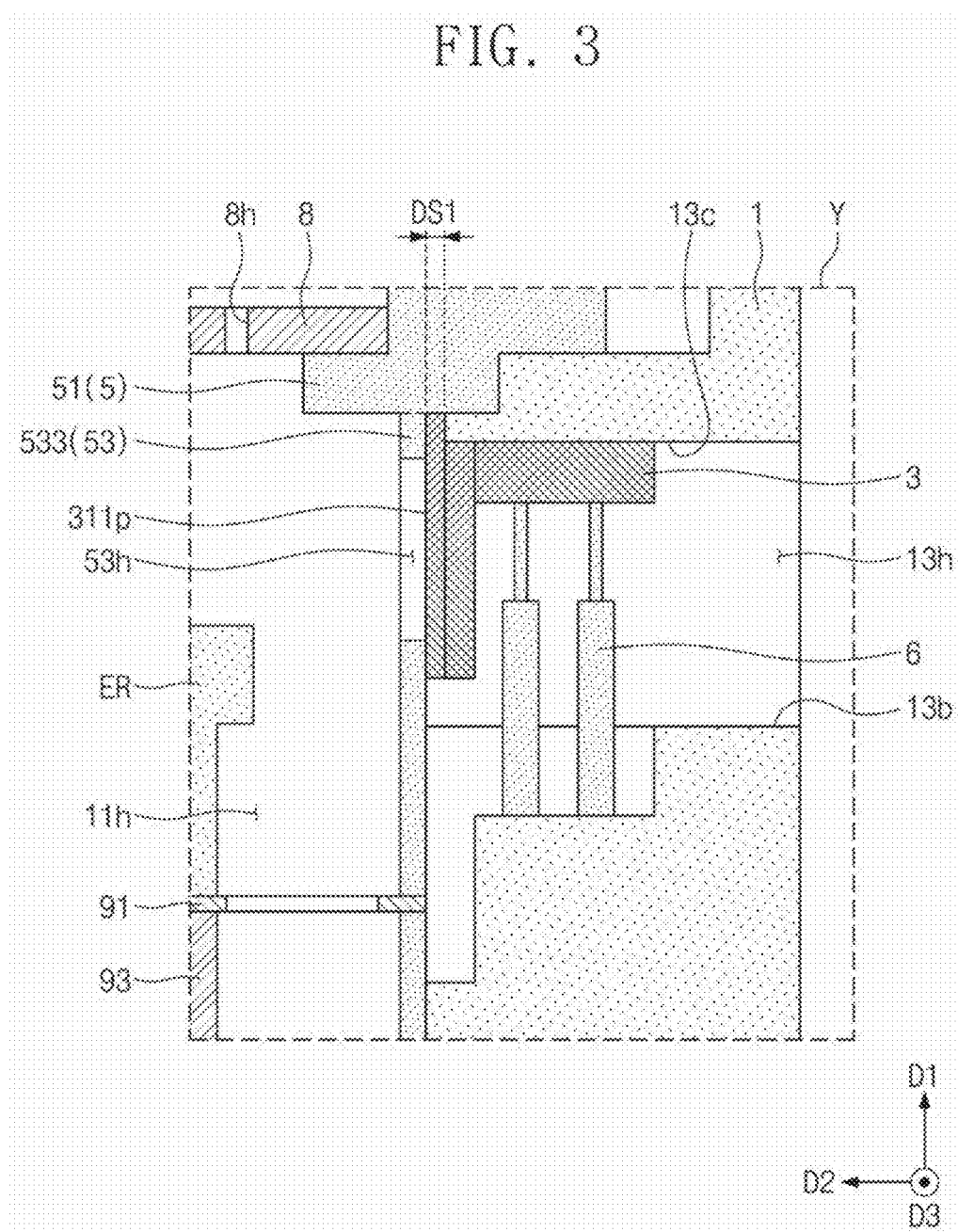
FIGS. 3 and 4 illustrate enlarged cross-sectional views showing section Y of FIG. 1.
Figure 4:
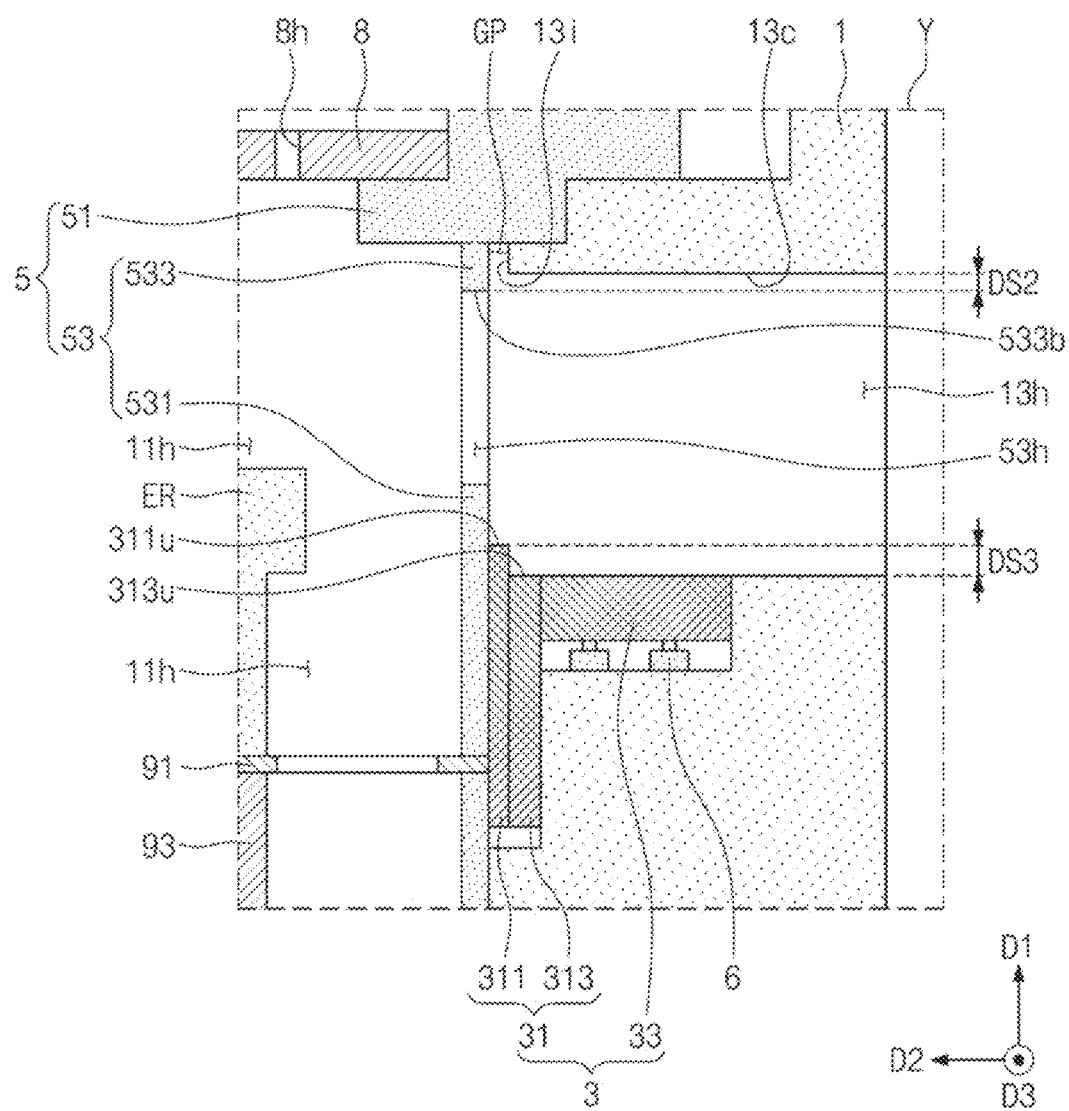
Figure 5:
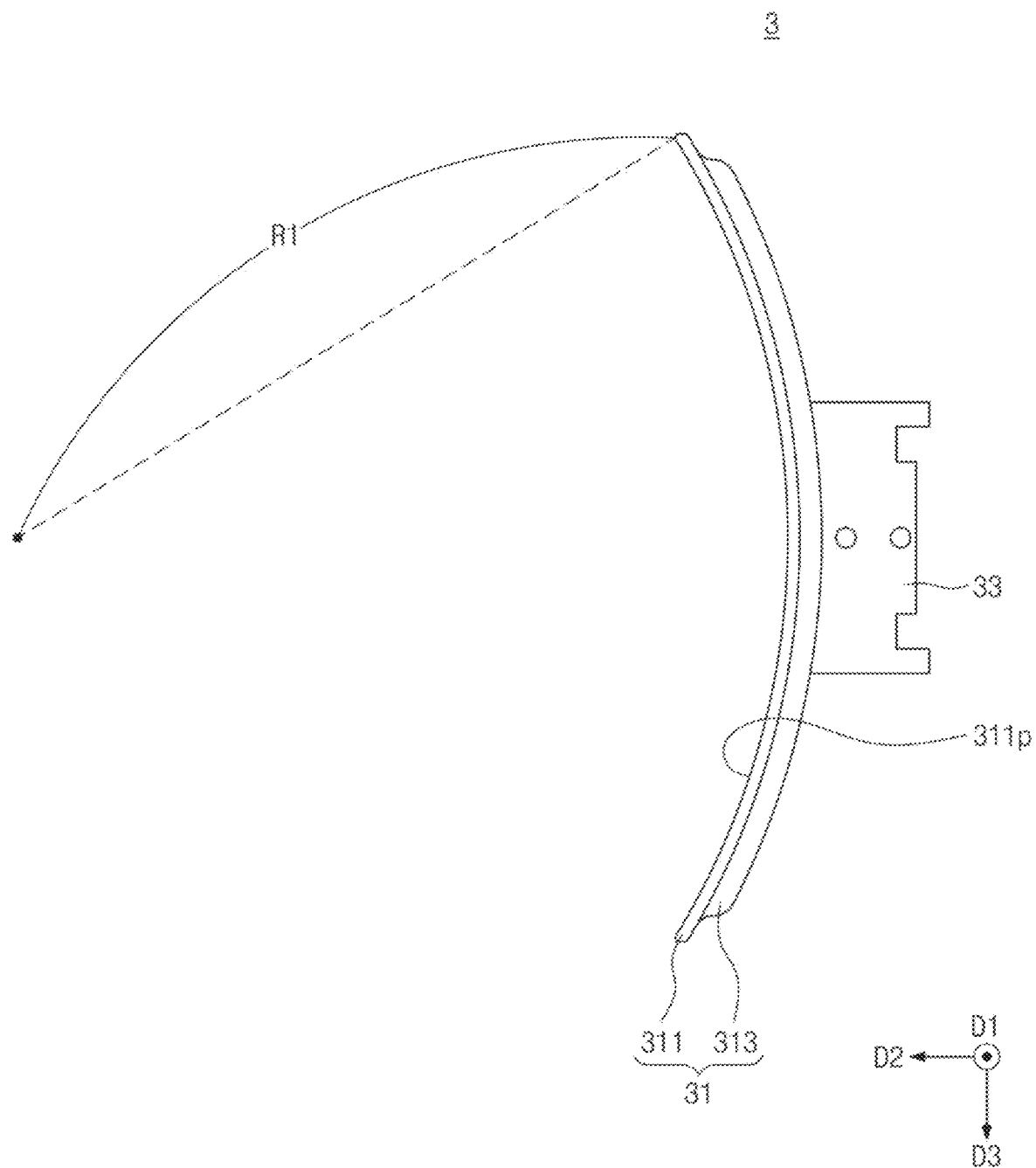
FIG. 5 illustrates a plan view showing a plasma shutter according to some embodiments.
Figure 6:
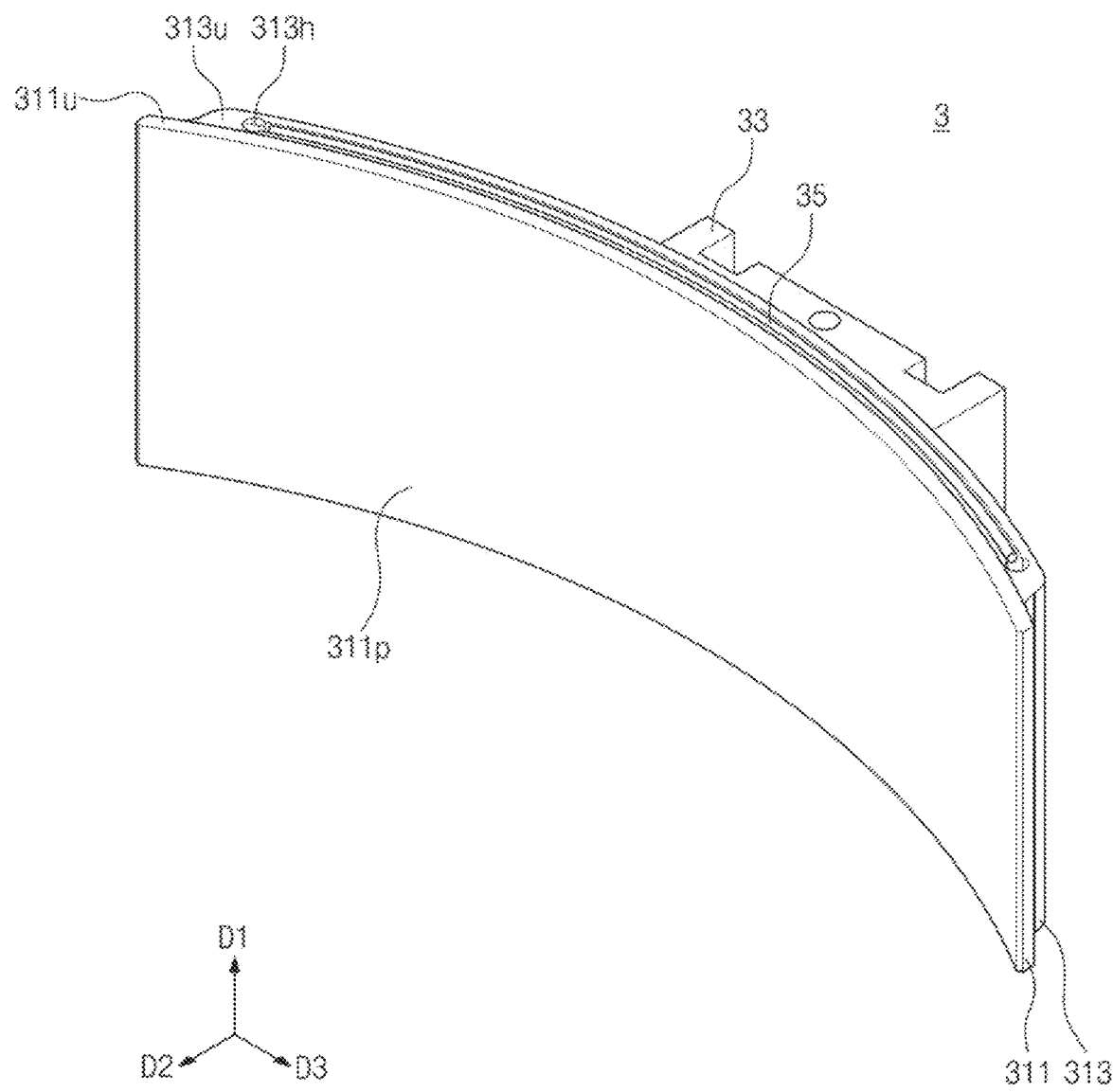
FIG. 6 illustrates a perspective view showing a plasma shutter according to some embodiments.
Figure 7:
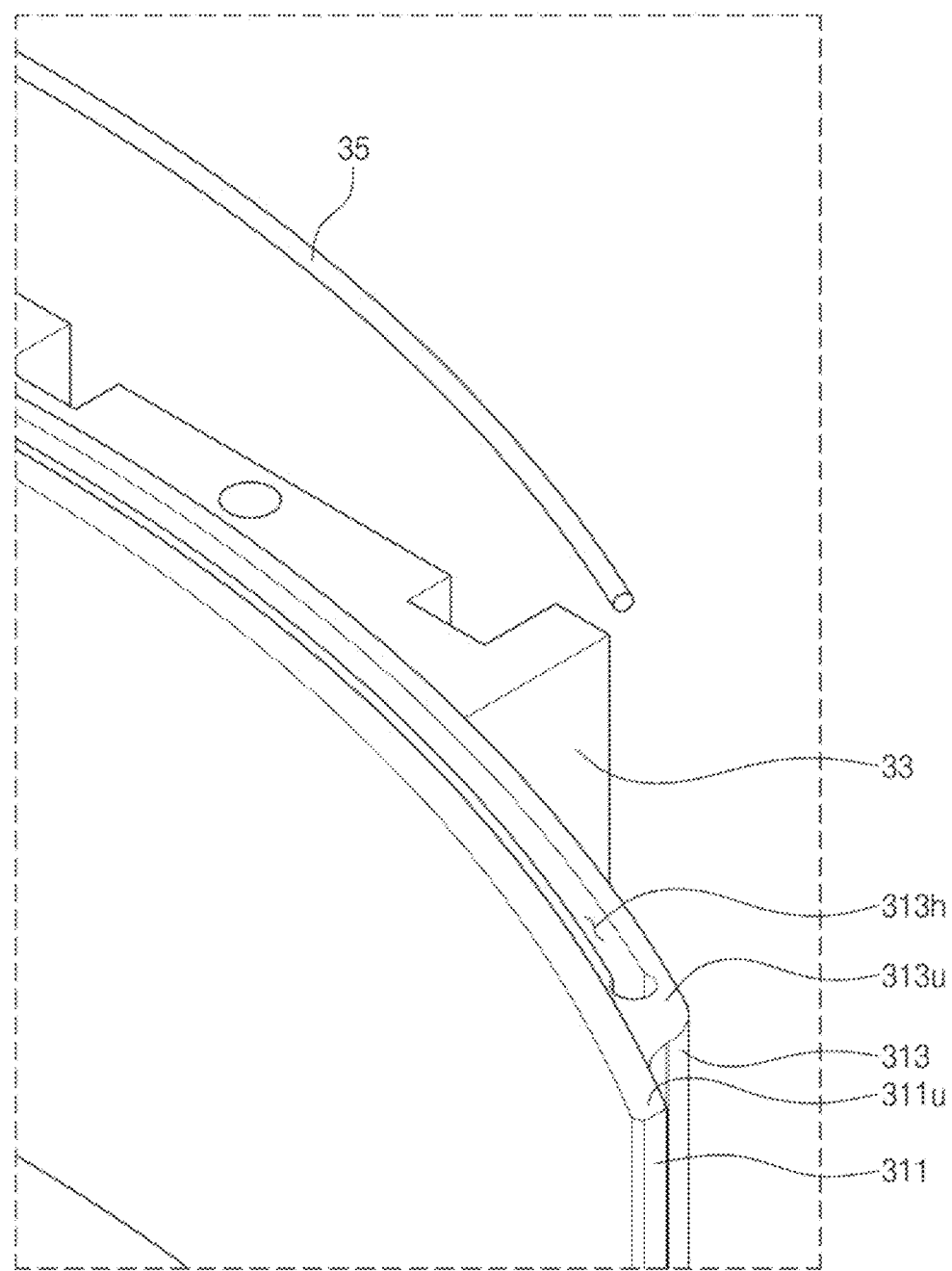
FIG. 7 illustrates an enlarged perspective view partially showing a plasma shutter according to some embodiments.
Figure 8:
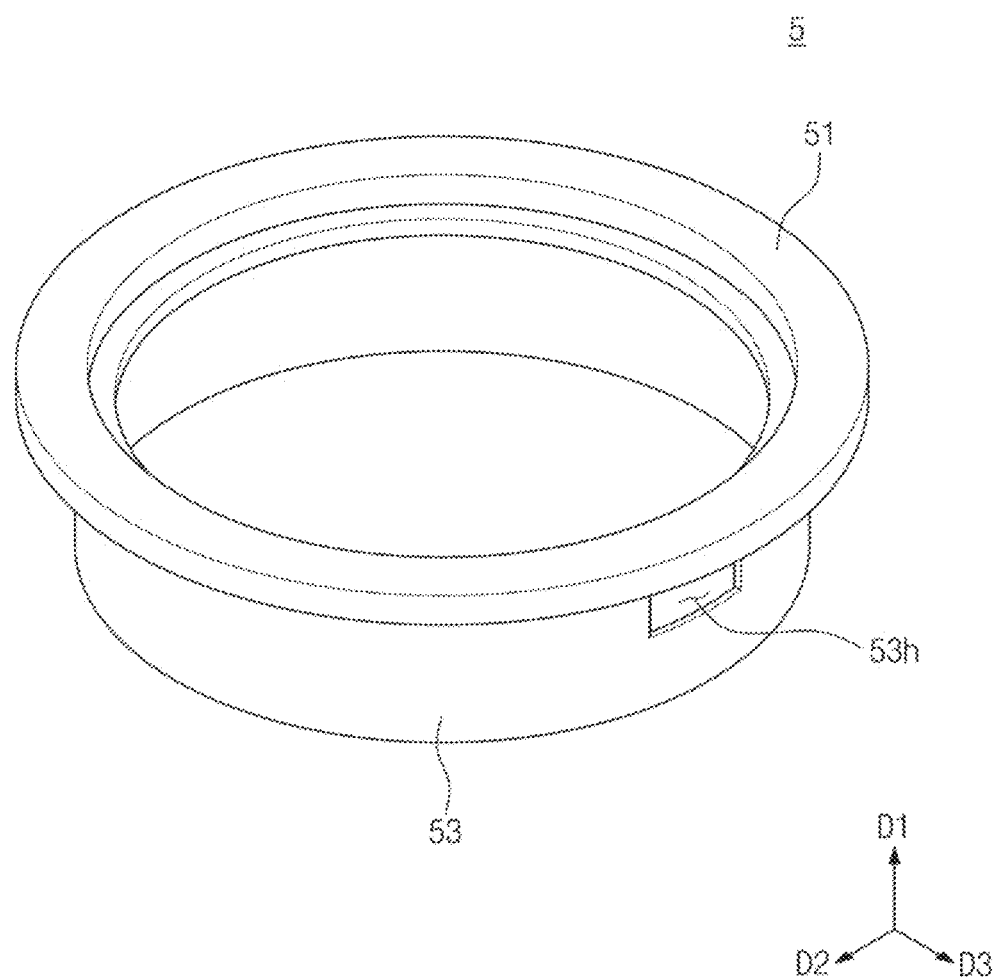
FIG. 8 illustrates a perspective view showing an upper liner according to some embodiments.

FIGS. 3 and 4 illustrate enlarged cross-sectional views showing section Y of FIG. 1. FIG. 5 illustrates a plan view showing a plasma shutter according to some embodiments. FIG. 6 illustrates a perspective view showing a plasma shutter according to some embodiments. FIG. 7 illustrates an enlarged perspective view partially showing a plasma shutter according to some embodiments. FIG. 8 illustrates a perspective view showing an upper liner according to some embodiments.

Referring to FIGS. 3 and 4, the substrate processing apparatus (see A of FIG. 1) may further include a middle liner 91 and a lower liner 93. The middle liner 91 may be positioned below the upper liner 5. One end of the middle liner 91 may be connected to the process chamber 1. Another end of the middle liner 91 may be connected to the stage 7 (FIG. 1). The middle liner 91 may provide a slit. For example, the middle liner 91 may be a baffle. The lower liner 93 may be positioned below the middle liner 91 in the vertical direction (D1). The lower liner 93 may be combined with an inner lateral surface of the process chamber 1 and/or to the stage 7. In some embodiments, each of the middle liner 91 and the lower liner 93 may include aluminum (Al), but embodiments are not limited thereto.

The insertion passage 13h may extend in the horizontal direction. The insertion passage 13h may be formed by the process chamber 1. For example, the insertion passage 13h may be formed by a passage ceiling 13c and a passage floor 13b of the process chamber 1. The passage ceiling 13c may face the passage floor 13b. The passage ceiling 13c may be above and spaced apart from the passage floor 13b in the vertical direction (D1). The insertion passage 13h may be formed between the passage ceiling 13c and the passage floor 13b. The process chamber 1 may include a connection inner surface 13i. The connection inner surface 13i may upwardly extend from an inner end of the passage ceiling 13c in the vertical direction (D1).

Referring to FIGS. 3, 4, and 8, the upper liner 5 may be combined with the process chamber 1. For example, at least a portion of the upper liner 5 may be combined with an inner surface of the process chamber 1. The upper liner 5 may include an upper liner body 51 and an inner liner 53.

The upper liner body 51 may be positioned on the process chamber 1. The upper liner body 51 may have a ring shape. The upper liner body 51 may support the showerhead 8. For example, the showerhead 8 may be disposed on the upper liner body 51. The upper liner body 51 may include, for example, aluminum (Al).

The inner liner 53 may downwardly extend from the upper liner body 51 in the vertical direction (D1). The inner liner 53 may downwardly extend beyond the passage floor 13b or a floor of the insertion passage 13h. The inner liner 53 may include, for example, aluminum (Al). The inner liner 53 may have a hollow cylindrical shape. The inner liner 53 may provide a liner insertion hole 53h. The liner insertion hole 53h may penetrate one side of the inner liner 53. The liner insertion hole 53h may be positioned between the insertion hole 53h and the process space 11h. The insertion hole 53h and the process space 11h may be connected through the liner insertion hole 53h. As illustrated in FIG. 4, an extension liner 533 may indicate a portion positioned on the liner insertion hole 53h of the inner liner 53. An inner liner body 531 may indicate a portion other than the extension liner 533 of the inner liner 53. The inner liner body 531 may have a lower end at a lower level than that of the passage floor 13b. The lower end of the inner liner body 531 may be in contact with the middle liner 91, but embodiments are not limited thereto.

The extension liner 533 may be inwardly spaced apart from the connection inner surface 13i. Therefore, a gap GP may be formed between the extension liner 533 and the connection inner surface 13i. The connection inner surface 13i may face the extension liner 533. For example, an outer surface of the extension liner 533 may face the connection inner surface 13i. A width of the gap GP may be a first distance DS1. The first distance DS1 may range, for example, from about 1 mm to about 15 mm. For example, the first distance DS1 may range from about 1 mm to about 10 mm. Embodiments, however, are not limited thereto.

The liner insertion hole 53h may be formed by a bottom surface 533b of the extension liner 533. For example, the bottom surface 533b of the extension liner 533 may be located at a lower level than that of the passage ceiling 13c. A second distance DS2 may indicate a difference in level between the passage ceiling 13c and the bottom surface 533b of the extension liner 533. The second distance DS2 may range, for example, from about 6 mm to about 10 mm.

Referring to FIGS. 3, 4, 5, 6, and 7, the plasma shutter 3 may include a shield door 31, a connection block 33, and a gasket 35. As illustrated in FIG. 3, a portion of the plasma shutter 3 may be inserted between the extension liner 533 and the connection inner surface 13i. For example, in a state where the plasma shutter 3 is closed, an upper end of the shield door 31 may be inserted into the gap GP formed between the extension liner 533 and the connection inner surface 13i.

The shield door 31 may include a shield member 311 and a support member 313.

The shield member 311 may have a plasma shield surface 311p. The plasma shield surface 311p may be a front surface of the shield member 311. The plasma shield surface 311p may be exposed to the process space 11h. For example, the plasma shield surface 311p may be exposed through the liner insertion hole 53h to the process space 11h. The plasma shield surface 311p may be positioned closer to the outer side of the process chamber 1 than the inner liner 53. The plasma shield surface 311p may be in contact with an outer surface of the inner liner 53. The plasma shield surface 311p may include $Y_2O_3$. For example, the plasma shield surface 311p may be coated with $Y_2O_3$. The shield member 311 may include aluminum (Al) at a portion other than the plasma shield surface 311p. The plasma shield surface 311p may have an arc shape when viewed in plan view as illustrated in FIG. 5. The plasma shield surface 311p may be convexly bent toward the connection block 33 to have a curved line when viewed in plan. The plasma shield surface 311p may have a curvature center positioned in the process space 11h. A first radius R1 may indicate a curvature radius of the plasma shield surface 311p. The first radius R1 may range from about 270 mm to about 295 mm, but embodiments are not limited thereto.

The support member 313 may be positioned on a rear surface of the shield member 311. On a side opposite to the plasma shield surface 311p, the support member 313 may be combined with the shield member 311. As illustrated in FIG. 4, a top surface 313u of the support member 313 may be positioned at a lower level a top surface 311u of the shield member 311 in the vertical direction (D1). For example, the top surface 311u of the shield member 311 may be located at a higher level than that of the top surface 313u of the support member 313. A third distance DS3 may indicate a difference in level between the top surface 311u of the shield member 311 and the top surface 313u of the support member 313. The third distance DS3 may range, for example, from about 4 mm to about 8 mm. The support member 313 may include aluminum (Al), but embodiments are not limited thereto.

An upper end of the plasma shutter 3 may mean the top surface 311u of the shield member 311. When the plasma shutter 3 ascends to be closed, a portion of the shield member 311 may be inserted into the gap GP. For example, when the plasma shutter 3 ascends to be closed, the top surface 311u of the shield member 311 may be inserted between the extension liner 533 and the connection inner surface 13i. In addition, in a state where the plasma shutter 3 ascends and closes the process space 11h, the top surface 313u of the support member 313 may be in contact with the passage ceiling 13c.

A gasket groove 313h may be formed on the top surface 313u of the support member 313. The gasket groove 313h may be a hole that is downwardly recessed from the top surface 313u of the support member 313. The gasket groove 313h may extend along an extending direction of the support member 313. The gasket groove 313h may have a width of about 3.0 mm to about 7.0 mm.

The connection block 33 may be coupled adjacent to and behind the shield door 31 in a horizontal direction (D2). The connection block 33 may have a rectangular hexahedron shape, but embodiments are not limited thereto. The connection block 33 may connect the shield door 31 and the shutter driving mechanism 6 to each other.

A gasket 35 may be inserted into the gasket groove 313h. The gasket 35 may include a nickel alloy. For example, the gasket 35 may include Hastelloy. The gasket 35 may include a spiral gasket. For example, the gasket 35 may have a spiral shape. The gasket 35 may have a diameter of about 3.0 mm to about 6.0 mm.

Referring back to FIGS. 3 and 4, the shutter driving mechanism 6 may be combined with the plasma shutter 3. For example, the shutter driving mechanism 6 may be combined with a bottom surface of the connection block 33. The shutter driving mechanism 6 may drive the plasma shutter 3 to ascend or descend. The shutter driving mechanism 6 may include various kinds of actuator. For example, the shutter driving mechanism 6 may include a motor or a hydraulic cylinder. The shutter driving mechanism 6 may be positioned below the insertion passage 13h, but embodiments are not limited thereto.

Figure 9:
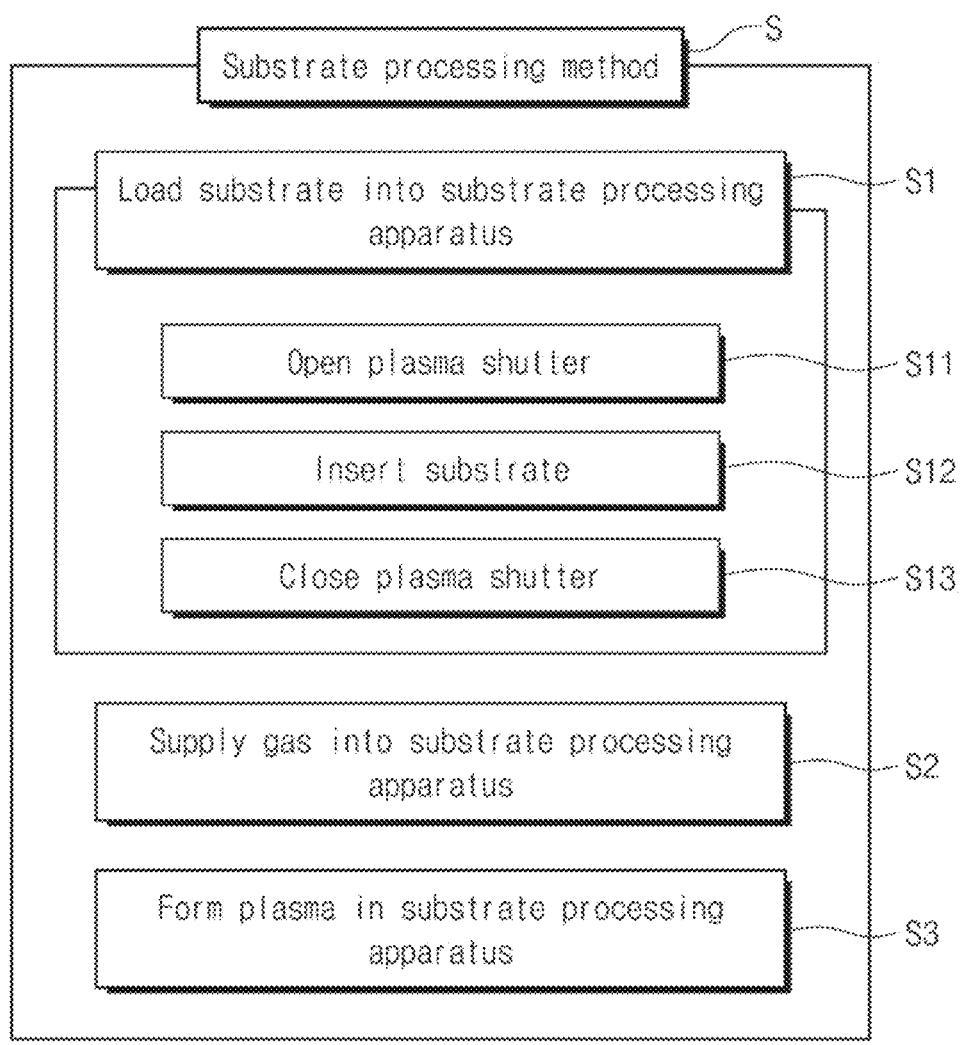
FIG. 9 illustrates a flow chart showing a substrate processing method according to some embodiments.

FIG. 9 illustrates a flow chart showing a substrate processing method according to some embodiments.

FIG. 9 illustrates a substrate processing method S according to an embodiment. The substrate processing method S may be a method of treating a substrate by using the substrate processing apparatus (see A of FIG. 1) discussed with reference to FIGS. 1 to 8. The substrate processing method S may include loading a substrate into a substrate processing apparatus (S1), supplying a gas to the substrate processing apparatus (S2), and forming plasma in the substrate processing apparatus (S3).

The substrate loading step S1 may include opening a plasma shutter (S11), inserting the substrate (S12), and closing the plasma shutter (S13).

The substrate processing method S of FIG. 9 will be discussed in detail below with reference to FIGS. 10 to 15.

FIGS. 10 to 15 illustrate cross-sectional views showing the substrate processing method according to the flow chart of FIG. 9.

Figure 10:
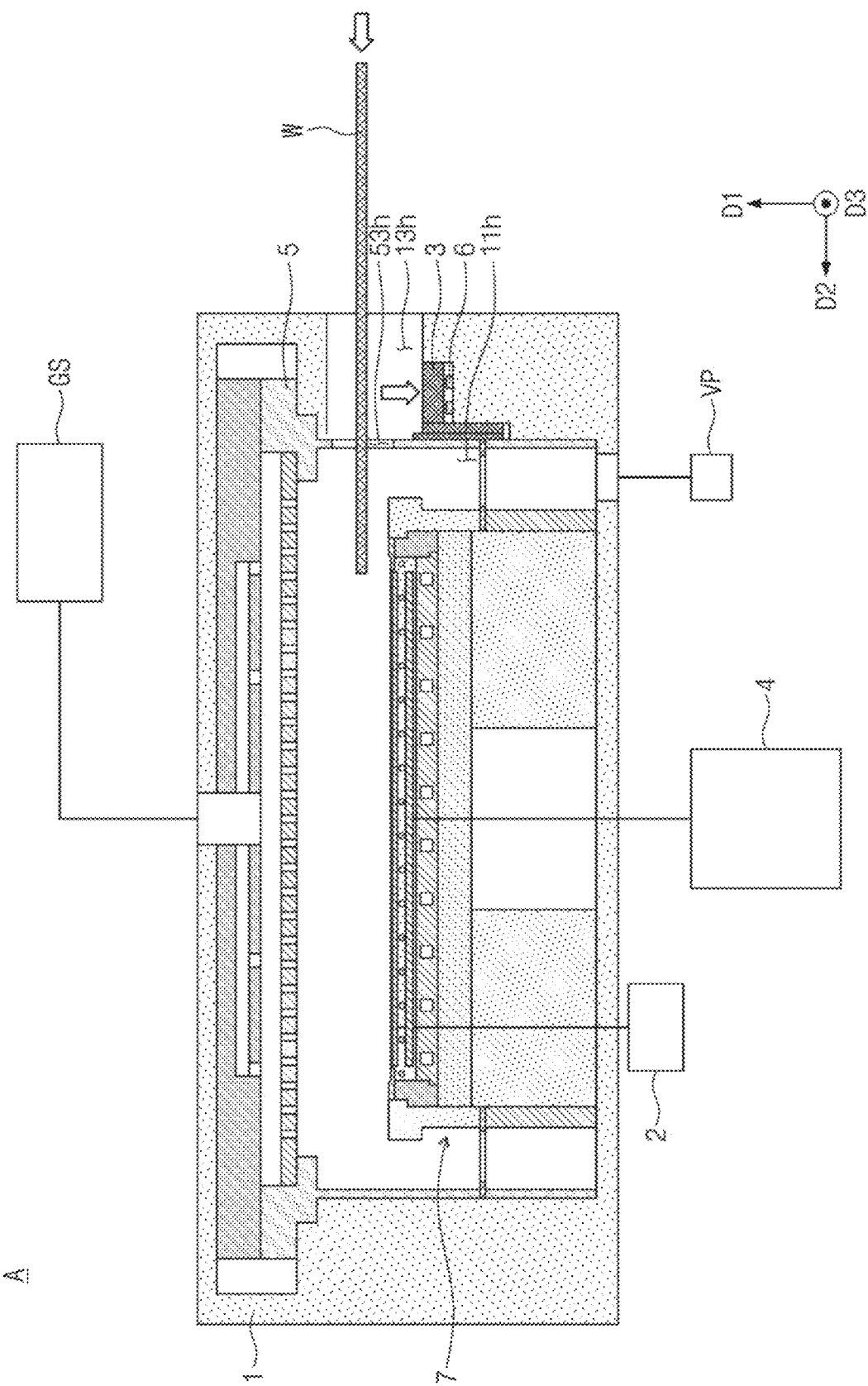
FIGS. 10, 11, 12, 13, 14, and 15 illustrate cross-sectional views showing the substrate processing method according to the flow chart of FIG. 9.

Referring to FIGS. 9 and 10, the plasma shutter opening step S11 may include the shutter driving mechanism 6 moving the plasma shutter 3 down. When the plasma shutter 3 descends, the process space 11h and the insertion passage 13h may be connected through the liner insertion hole (see 53h of FIG. 4).

The substrate insertion step S12 may include allowing a substrate W to sequentially pass through the insertion passage 13h and the liner insertion hole 53h and then to enter the process space 11h. A robot arm may introduce the substrate W into the process space 11h.

Figure 11:
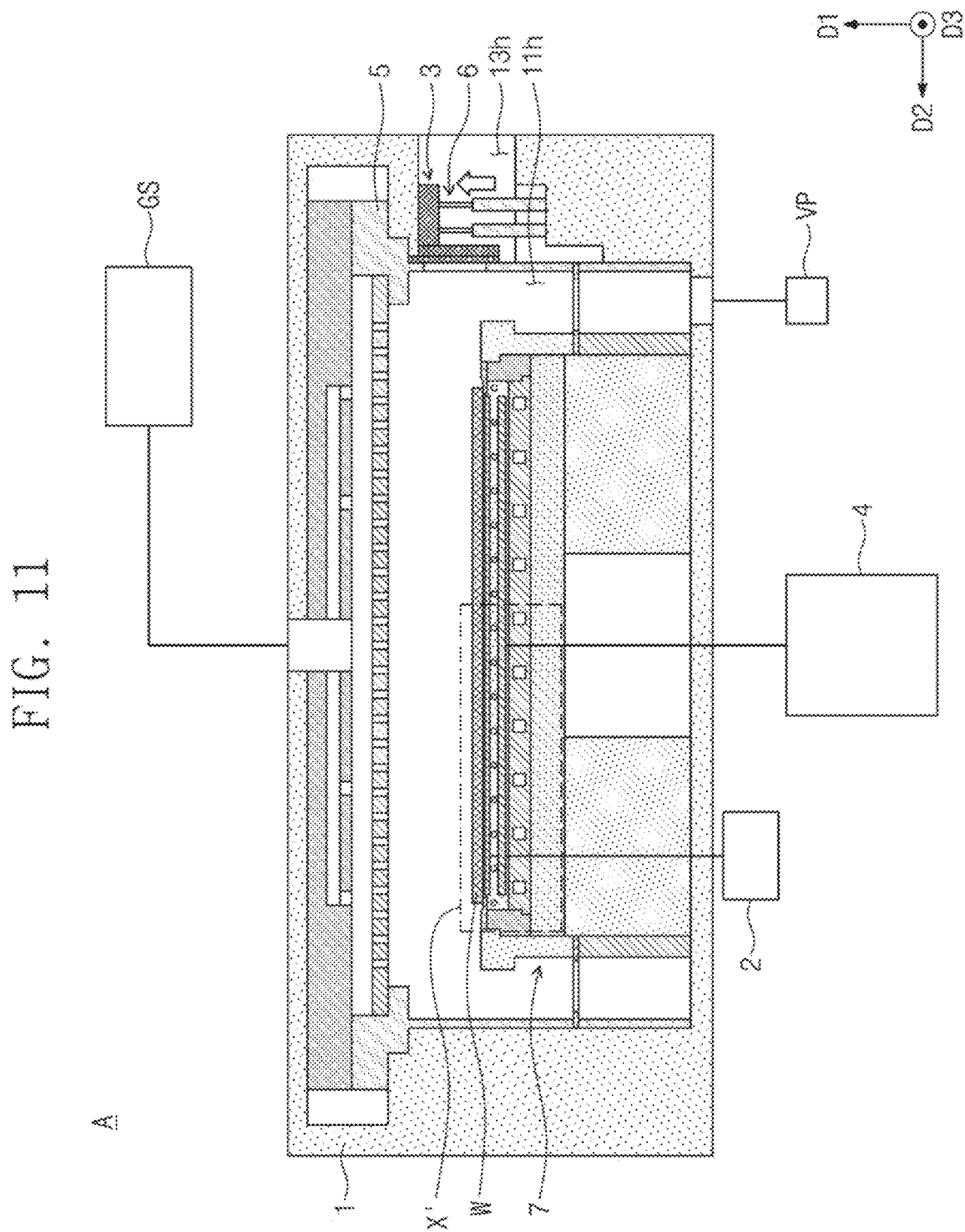
Figure 12:
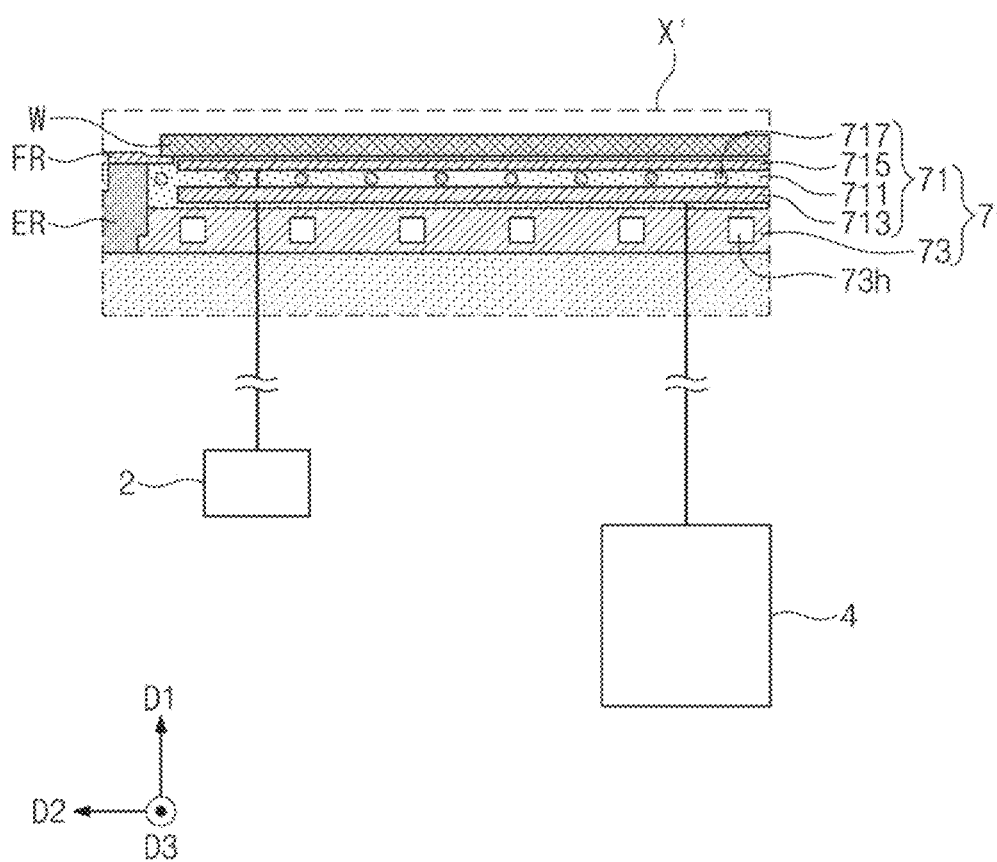

Referring to FIGS. 9, 11, and 12, the substrate W may be disposed on the stage 7. When the DC power generator 2 applies the DC power to the chuck electrode 715, the substrate W may be more rigidly placed on a certain position on the stage 7.

Figure 13:
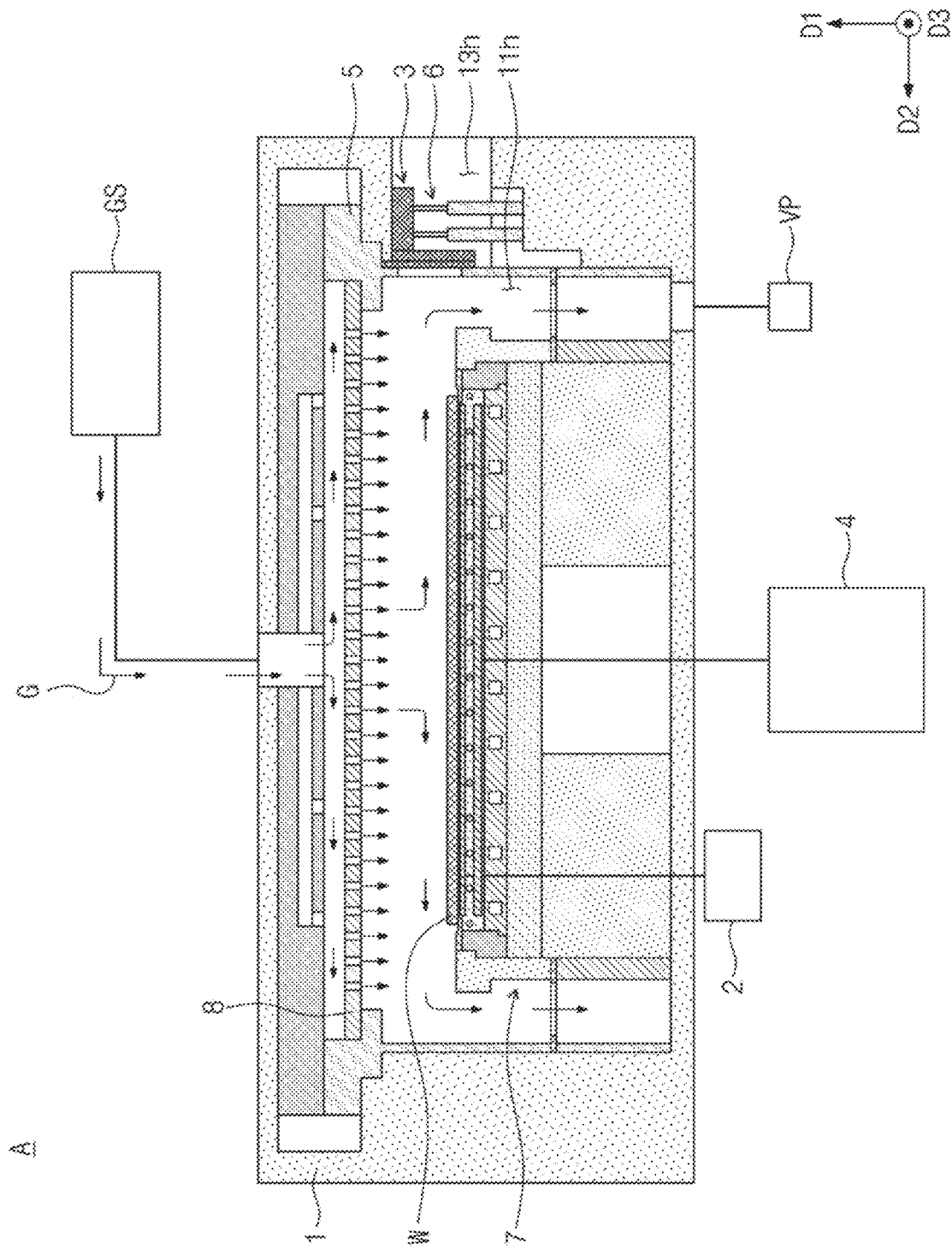

Referring to FIGS. 9 and 13, the gas supply step S2 may include the gas supply device GS supplying gas G to the process space 11h. The gas G may be distributed through the showerhead 8 onto the substrate W.

Figure 14:
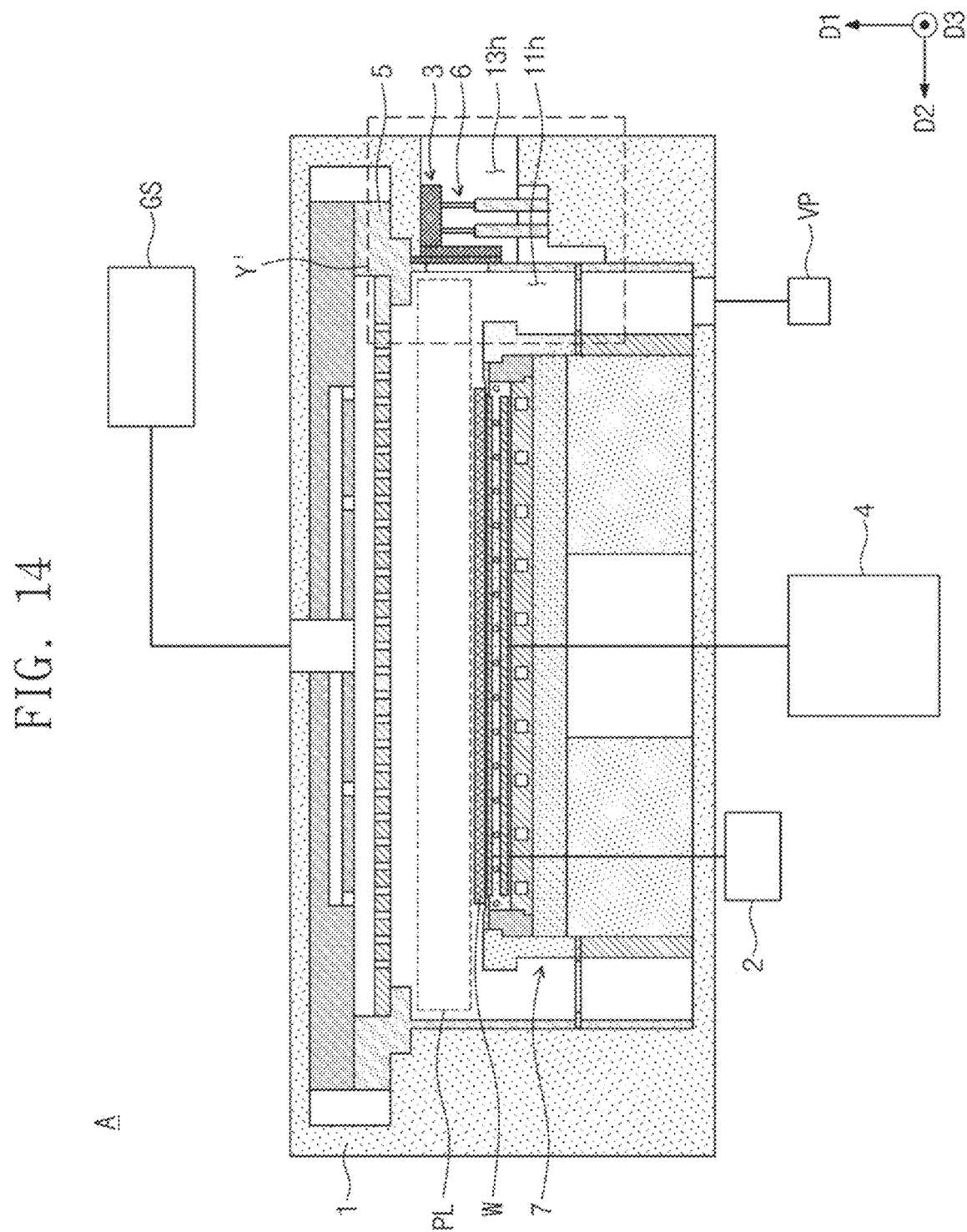

Referring to FIGS. 9 and 14, the plasma generation step S3 may include the RF power generator 4 applying the RF power to the plasma electrode 713. When the RF power is applied to the plasma electrode 713, a portion of gas in the process space 11h may be converted into plasma PL.

Figure 15:
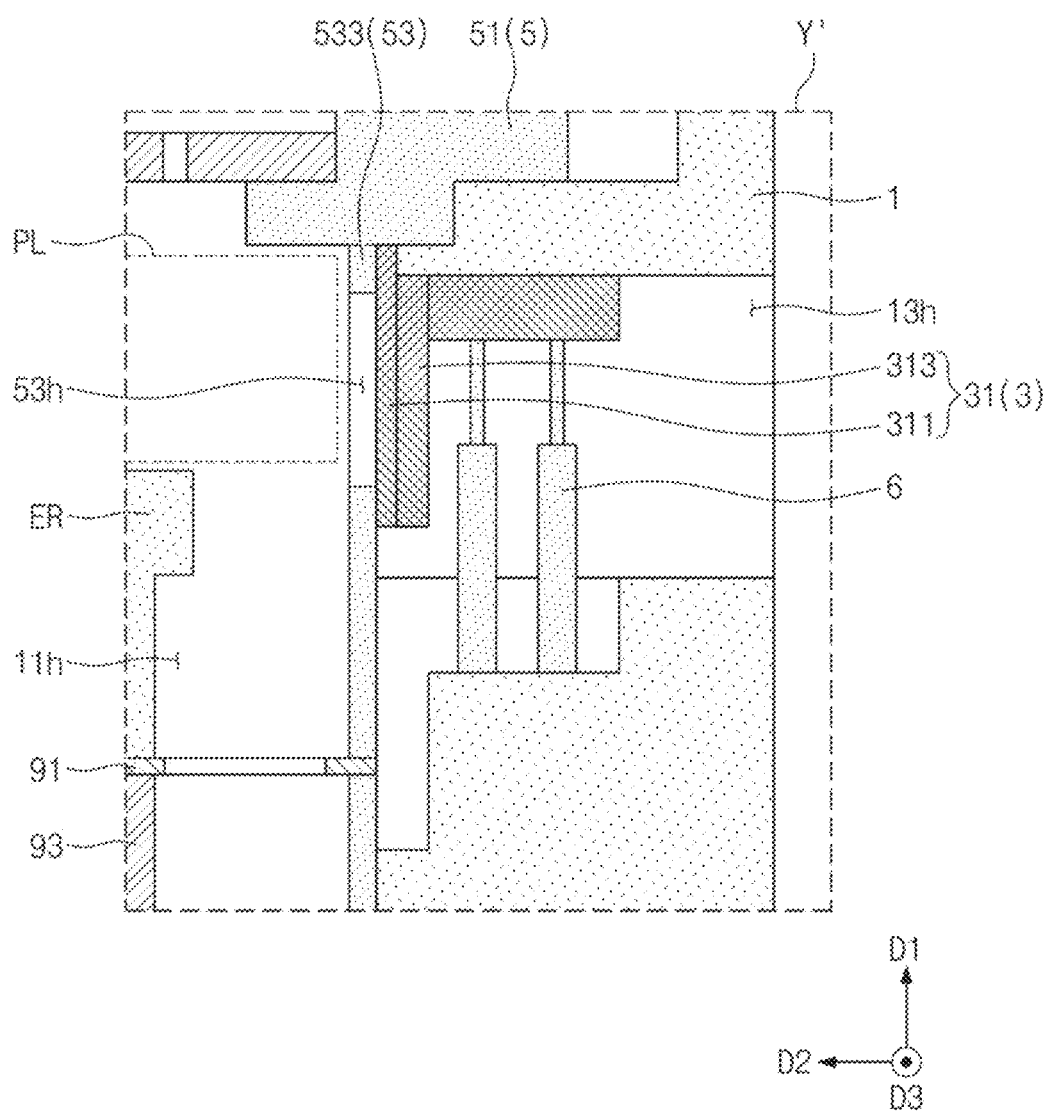

Referring to FIG. 15, a portion of the upper end of the shield door 31 may be inserted between the extension liner 533 and the process chamber 1. No cleavage may be present around the upper end of the shield door 31. Therefore, the plasma PL may be prevented from being leaked to the insertion passage 13h. In addition, no contact may occur between the process chamber 1 and the plasma PL.

According to a plasma shutter and a substrate processing apparatus including the same in accordance with some embodiments, a portion of a plasma shutter may be inserted between an upper liner and a process chamber. Therefore, the plasma shutter may be accurately disposed on a specific position. Accordingly, it may be possible to prevent misalignment of the plasma shutter. Thus, a process space may be fully closed.

According to a plasma shutter and a substrate processing apparatus including the same in accordance with some embodiments, as the plasma shutter is inserted between an upper liner and a process chamber, no contact may occur between the process chamber and plasma during process. Thus, no particle may be produced from the process chamber during process. A substrate in the process chamber may be free of contamination resulting from particles.

According to a plasma shutter and a substrate processing apparatus including the same in accordance with some embodiments, plasma may be prevented from being leaked through cleavage around the plasma shutter. Thus, the plasma dispersion may be improved. Accordingly, it may be possible to increase a substrate process yield.

According to a plasma shutter and a substrate processing apparatus including the same in accordance with some embodiments, a gasket may be formed of a nickel alloy. Thus, the gasket may be free of damage in the progress of process. For example, the gasket may be prevented from an increase in electrical resistance in the progress of process. A lifetime of the gasket may therefore be increased and used for a relatively long time. In addition, it may be possible to increase a diameter of the gasket. Thus, a ground effect may be increased.

According to a plasma shutter and a substrate processing apparatus including the same in accordance with some embodiments, a process chamber and/or an upper liner may be prevented from being contaminated due to particles. Therefore, a lifetime of each component may increase.

According to a plasma shutter and a substrate processing apparatus including the same in accordance with embodiments, a plasma shutter may be aligned to fully close a process space.

According to a plasma shutter and a substrate processing apparatus including the same in accordance with embodiments, the occurrence of particle may be reduced.

According to a plasma shutter and a substrate processing apparatus including the same in accordance with embodiments, plasmas dispersion may be improved.

According to a plasma shutter and a substrate processing apparatus including the same in accordance embodiments, a substrate process may increase in yield.

Effects of the embodiments are not limited to the mentioned above, other effects which have not been mentioned above will be clearly understood to those skilled in the art from the following description.

While embodiments have been described with reference to the figures, it will be understood by those of ordinary skill in the art that various changes in form and details may be made therein without departing from the spirit and scope as defined by the following claims and their equivalents.

What is claimed is:

1. A substrate processing apparatus, comprising:
    a process chamber;
    a plasma shutter configured ascend to close the process chamber; and
    an upper liner on the process chamber,
    wherein the process chamber comprises:
        a process space in which a substrate process is performed; and
        an insertion passage adjacent to the process space and connecting the process space to an outside of the process chamber,
    wherein the upper liner comprises an extension liner,
    wherein the extension liner faces a connection inner surface that upwardly extends from an inner end of a passage ceiling forming the insertion passage, and
    wherein, in a state where the plasma shutter ascends to close the process space, an upper end of the plasma shutter is inserted between the connection inner surface and the extension liner.

2. The substrate processing apparatus of claim 1, wherein a level of a bottom surface of the extension liner is lower than a level of the passage ceiling in a vertical direction.

3. The substrate processing apparatus of claim 1, wherein a distance between the extension liner is and the connection inner surface is from 1 mm to 15 mm.

4. The substrate processing apparatus of claim 1, wherein the upper liner further comprises an upper liner body on the process chamber, and
    wherein the extension liner downwardly extends from the upper liner body in a vertical direction.

5. The substrate processing apparatus of claim 4, wherein the upper liner further comprises an inner liner that downwardly extends from the upper liner body in a vertical direction,
    wherein the inner liner downwardly extends beyond a level of a floor of the insertion passage in the vertical direction,
    wherein a liner insertion hole penetrates the inner liner and connects the insertion passage and the process space to each other,
    wherein the extension liner is a portion of the inner liner that is above the liner insertion hole in the vertical direction, and
    wherein a bottom surface of the extension liner forms the liner insertion hole.

6. The substrate processing apparatus of claim 4, further comprising a stage included in the process space,
    wherein the stage comprises a chuck configured to support a substrate.

7. The substrate processing apparatus of claim 6, further comprising a showerhead above and spaced apart from the stage in the vertical direction,
    wherein the showerhead is disposed on the upper liner body.

8. The substrate processing apparatus of claim 1, further comprising a shutter driving mechanism configured to move the plasma shutter up and down,
    wherein the shutter driving mechanism is below the insertion passage in a vertical direction.

9. The substrate processing apparatus of claim 1, wherein the plasma shutter comprises a shield door,
    wherein the shield door comprises:
        a shield member having a plasma shield surface exposed to the process space; and
        a support member on the shield member opposite to the plasma shield surface,
    wherein a level of a top surface of the shield member is higher than a level of a top surface of the support member in a vertical direction,
    wherein an upper end of the plasma shutter is the top surface of the shield member, and
    wherein the plasma shield surface is disposed closer to an outer side of the process chamber than the extension liner.

10. The substrate processing apparatus of claim 9, wherein the plasma shield surface has an arc shape when viewed in a plan view.

11. The substrate processing apparatus of claim 9, wherein, in a state where the plasma shutter ascends to close the process space, the top surface of the support member is in contact with the passage ceiling.

12. A plasma shutter, comprising:
    a shield door; and
    a connection block adjacent to the shield door,
    wherein the shield door comprises:
        a shield member having a plasma shield surface; and
        a support member on a surface of the shield member opposite to the plasma shield surface,
    wherein the plasma shield surface is convexly curved toward the connection block, and
    wherein a level of a top surface of the shield member is higher than a level of a top surface of the support member in a vertical direction.

13. The plasma shutter of claim 12, wherein the plasma shield surface comprises $Y_2O_3$.

14. The plasma shutter of claim 12, further comprising a gasket on the support member,
    wherein a gasket groove is formed on the top surface of the support member, and
    wherein the gasket is inserted into the gasket groove.

15. The plasma shutter of claim 14, wherein the gasket comprises a nickel alloy.

16. The plasma shutter of claim 12, wherein a difference between the level of the top surface of the shield member and the level of the top surface of the support member in the vertical direction is in a range of 4 mm to 8 mm.

17. The plasma shutter of claim 12, wherein the plasma shield surface has an arc shape,
    wherein a curvature radius of the plasma shield surface is in a range of 270 mm to 295 mm.

18. A plasma shutter, comprising:
a shield door;
a connection block adjacent to the shield door; and
a gasket,
wherein the shield door comprises:
   a shield member having a plasma shield surface; and
   a support member on a surface of the shield member opposite to the plasma shield surface,
wherein a level of a top surface of the shield member is higher than a level of a top surface of the support member in a vertical direction,
wherein a gasket groove is formed on the top surface of the support member, the gasket being inserted in the gasket groove, and
wherein the gasket comprises a nickel alloy.

19. The plasma shutter of claim 18, wherein a diameter of the gasket is in a range of 3.0 mm to 6.0 mm.

20. The plasma shutter of claim 18, wherein the gasket comprises a spiral gasket.

* * * * *